United States Patent [19]
Hirai et al.

[11] Patent Number: 5,214,291
[45] Date of Patent: May 25, 1993

[54] PATTERN FORMING METHOD

[75] Inventors: Yoshihiko Hirai, Osaka; Kazuhiko Hashimoto, Moriguchi; Takahiro Matuso, Uji, all of Japan

[73] Assignee: Matsushita Electric Industrial Co., Ltd., Osaka, Japan

[21] Appl. No.: 798,327

[22] Filed: Nov. 26, 1991

[30] Foreign Application Priority Data

Nov. 30, 1990 [JP] Japan .................................. 2-338149

[51] Int. Cl.⁵ ......................................... H01J 37/304
[52] U.S. Cl. .................................. 250/492.2; 250/398
[58] Field of Search ...................... 250/492.22, 492.23, 250/492.2 R, 398

[56] References Cited

U.S. PATENT DOCUMENTS 5,036,209 7/1991 Kataoka et al. ...................... 250/398
5,099,133 3/1992 Yamada ................................ 250/398

Primary Examiner—Jack I. Berman
Assistant Examiner—Kiet T. Nguyen
Attorney, Agent, or Firm—Stevens, Davis, Miller & Mosher

[57] ABSTRACT

In the case of manufacturing a dynamic memory of 256 MGbits or more according to a batch transfer process using a beam of electrons or a beam of charged particles, although the central resist pattern does not suffer from the insufficient exposure due to contribution of backscattered electrons from the surroundings to the resist exposure, but the peripheral resist pattern suffers from the insufficient exposure due to the proximity effect resulting from reduced backscattering of electrons during the exposure process. To cope with this, aperture portions of a mask for the peripheral resist pattern are corrected beforehand so as to make correction for the proximity effect of electrons on the peripheral resist pattern.

4 Claims, 5 Drawing Sheets

PATTERN FORMING METHOD

BACKGROUND OF THE INVENTION

This invention relates to a pattern forming method of manufacturing a semiconductor or the like that has a fine pattern.

A forming process using a beam of electrons or charged particles is capable of forming a pattern with a line thickness below 0.25 μ which can be hardly obtained by photolithography, and hence, it is considered that the prospects for developing a dynamic memory of 256 megabits to 1 gigabit is excellent. A batch transfer process which can assure a high throughput is efficient to mass-produce the semiconductor memory. For example, in a batch transfer process of semiconductor memory chip pattern disclosed in MONTHLY SEMICONDUCTOR WORLD 1990, 7, P170 "Electron beam block exposure technique", the whole pattern of a chip 61 is formed with the repetition of exposure to a block 23 by making use of the regularity of a memory cell circuit pattern in such a manner that a substrate (wafer) 22 is exposed repeatedly with use of a mask 51 containing a regular region which serves as a block 52 as shown in FIG. 4 while it being moved by a distance corresponding to exposure shots as indicated by arrow marks $l_1$ and $l_2$.

However, in the conventional method shown in FIG. 4, even with the repetitions of exposure by making use of the mask 51 of the same form, backscattered electrons from the surroundings contribute less to the exposure to a resist on the peripheral portion of the chip 61 than that on the central portion thereof, resulting in what is called "proximity effect" brought about by the insufficient exposure. This gives rise to a problem that, after exposure and developing, the line thickness of the pattern 25 in the peripheral portion of the chip becomes thinner as compared with that of the pattern 24 in the central portion of the chip as shown in FIG. 5, for example. For this reason, according to the exposure process using the conventional mask, it is impossible to make correction for the proximity effect caused due to the backscattering of electrons during the exposure process.

SUMMARY OF THE INVENTION

The present invention is intended to solve the problem of the prior art in such a manner that the proximity effect caused in the peripheral portion of a pattern formed by a batch transfer exposure process is corrected by exposing the central portion and the peripheral portion of a chip pattern with the use of a mask containing a group of aperture portions which are corrected beforehand. More specifically, the mask according to the present invention contains a first aperture portion and a group of second aperture portions each having an aperture pattern which is corrected along the first aperture portion or over its entirety. It is preferred that the group of second aperture portions consists of a plurality of apertures which are arranged vertically and horizontally, and peripheral four-corner portions along the first aperture portion and any or all of which are corrected for the proximity effect. There is provided a pattern forming method using the mask described above, comprising the steps of exposing a workpiece to a beam of charged particles such as a beam of electrons through the first aperture portion, and exposing, through the group of second aperture portions, peripheral portions along on area exposed through the first aperture portion.

According to the present invention, to cope with an excessive deficiency of the exposure caused in the peripheral portion of a chip due to the proximity effect resulting from the batch transfer exposure process, an aperture pattern which is corrected beforehand is used at the time of the exposure process so as to make it possible to make correction for the proximity effect all over the chip, thereby obtaining a transferred pattern in which the dimensional shift of the pattern is lessened.

DETAILED DESCRIPTION OF THE INVENTION

Figure 1:
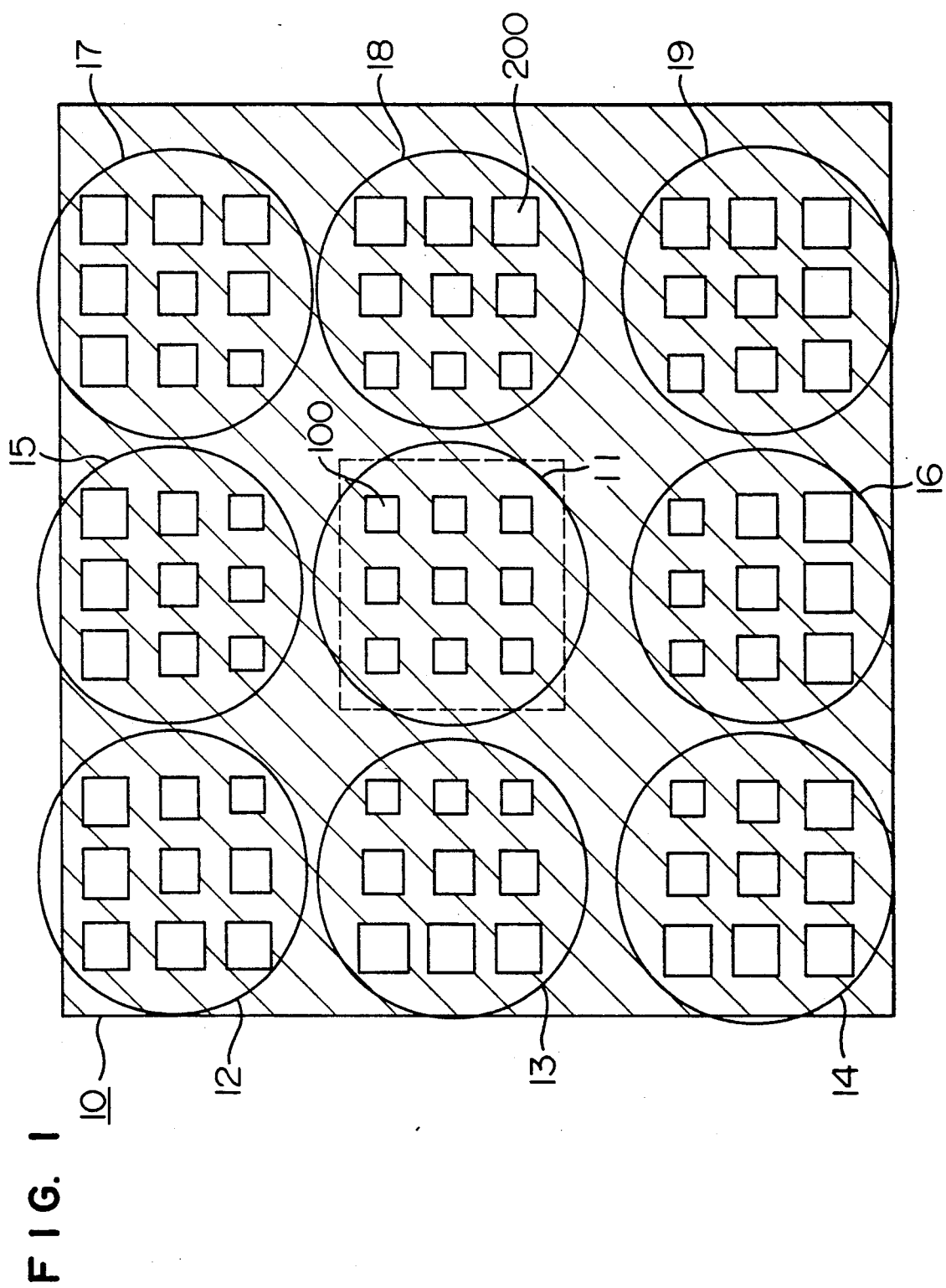
FIG. 1 is a plan view of a mask for use in an embodiment of the present invention.
Figure 2:
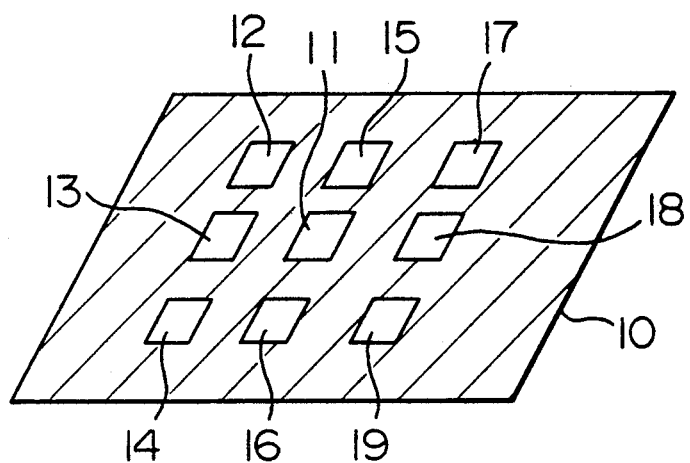
FIGS. 2(A-B) are illustrations for explanation of an exposure process according to an embodiment of the present invention.
Figure 3:
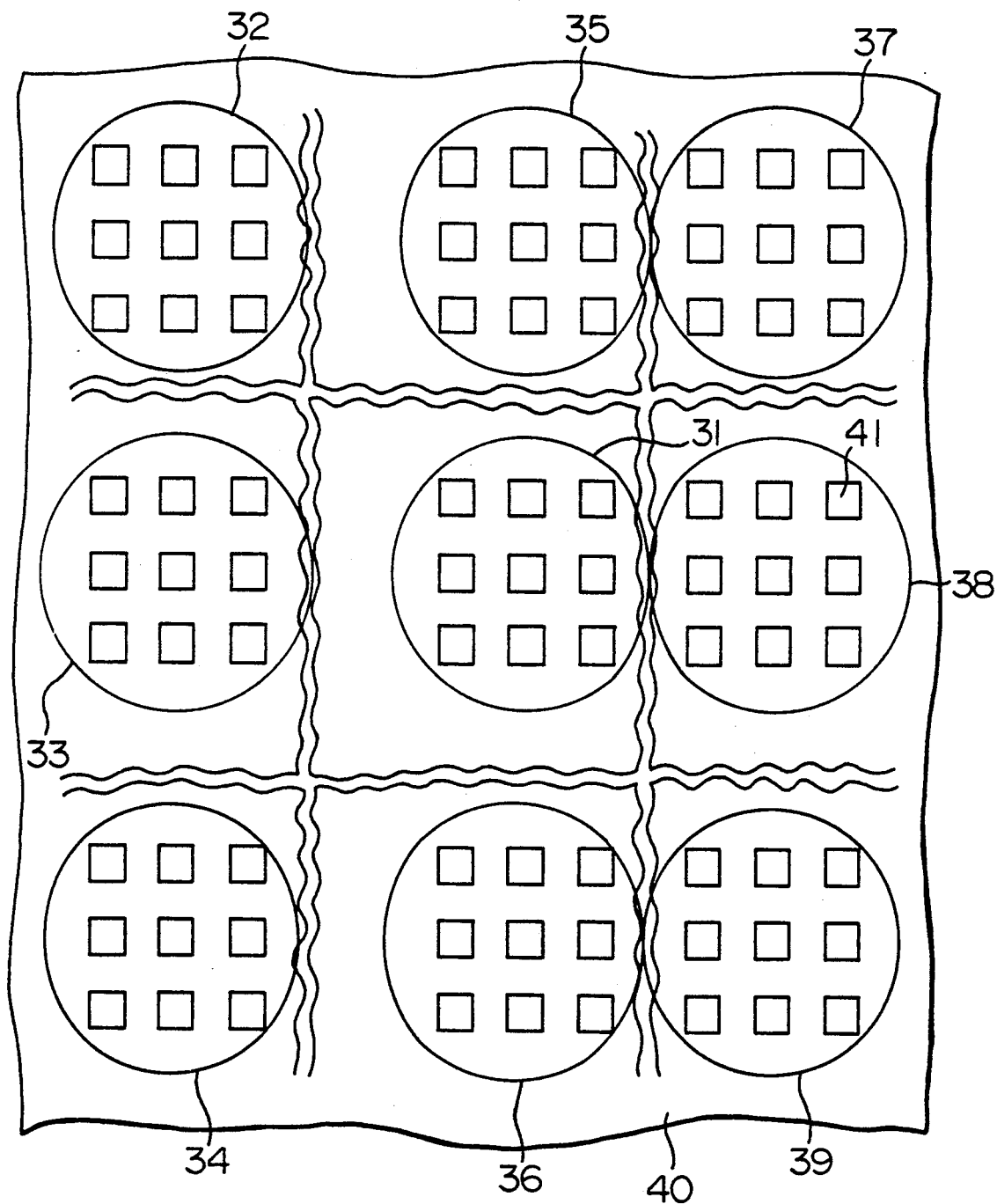
FIG. 3 is a plan view of a resist pattern after the developing, which pattern is obtained by the above mentioned exposure process.
Figure 4A:
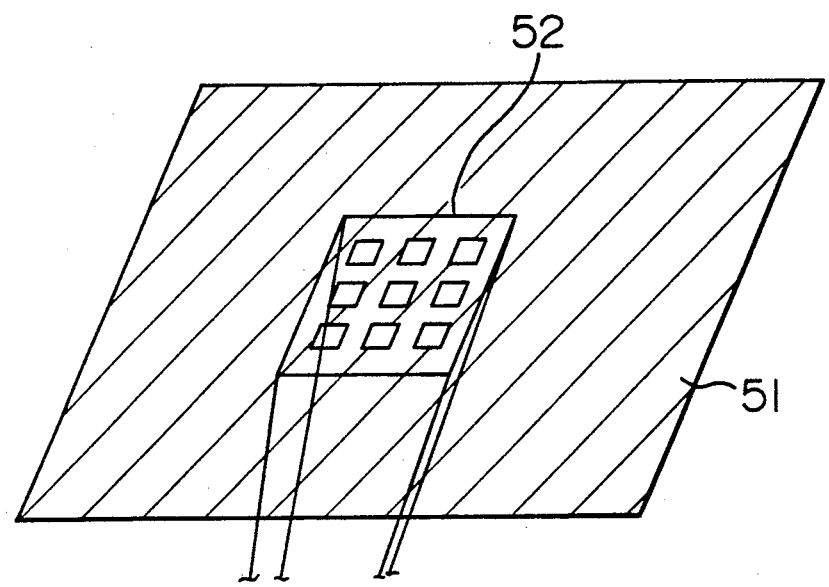
FIGS. 4(A-B) are illustrations for explanation of the conventional exposure process.
Figure 4B:
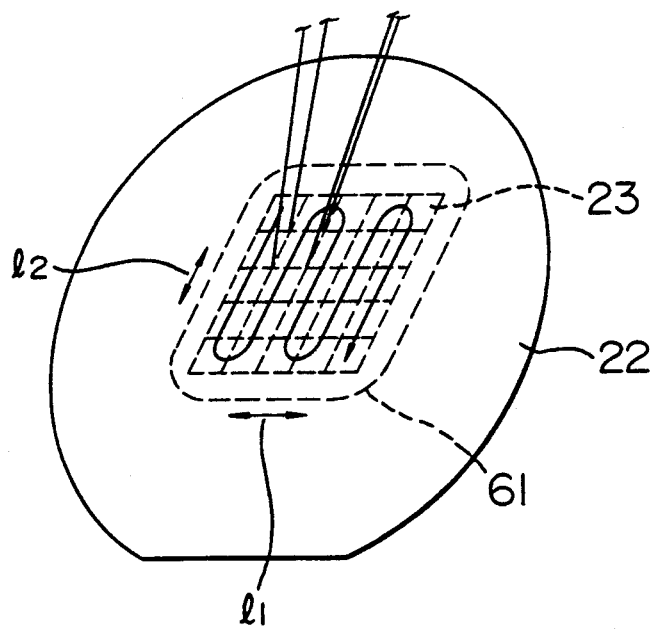
Figure 5:
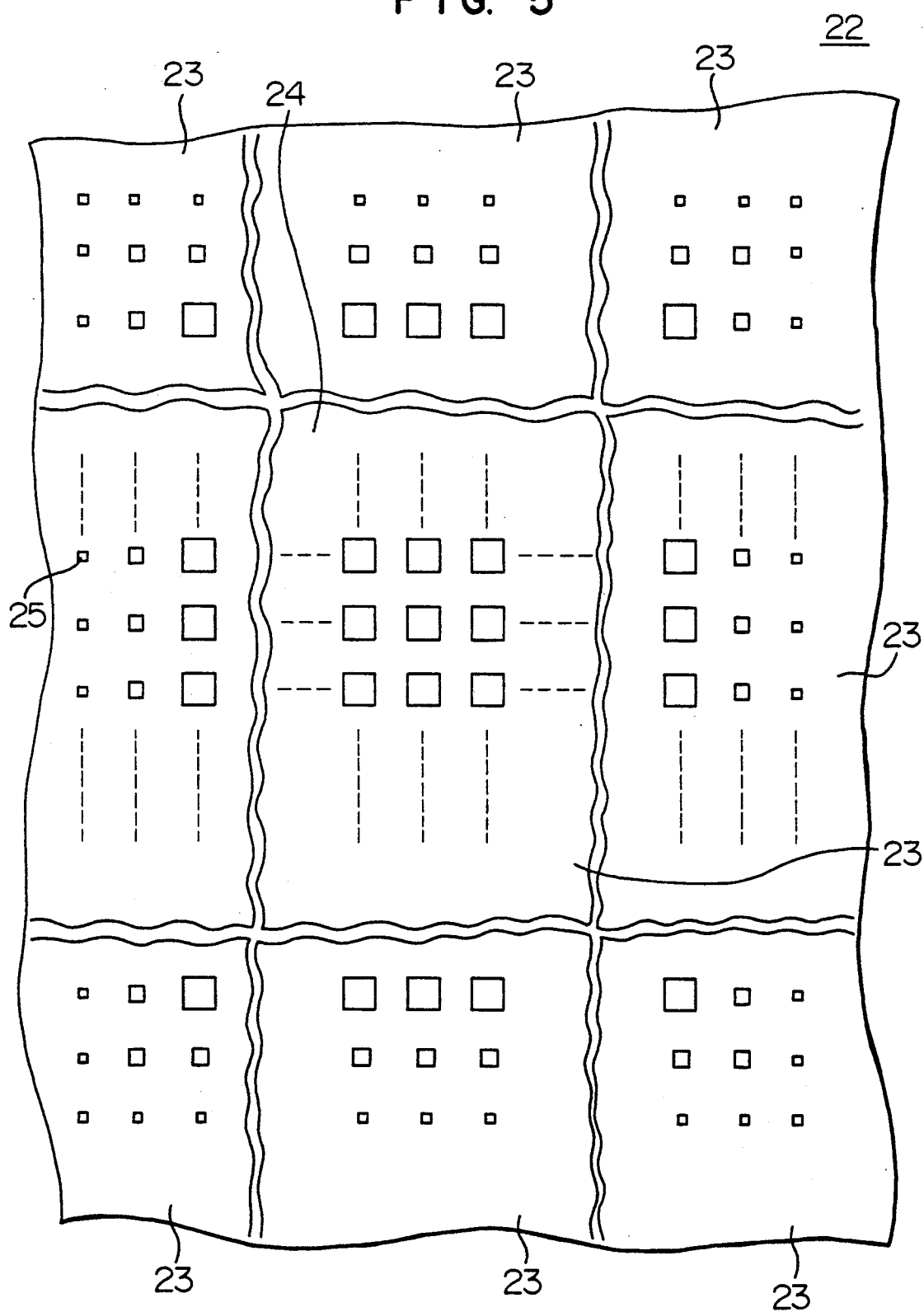
FIG. 5 is a plan view of a resist pattern after developing, which pattern is obtained by the conventional exposure process.

FIG. 1 is a plan view of a mask 10 according to an embodiment of the present invention. Reference numeral 11 denotes a first aperture portion, and 12 to 19 denote a group of second aperture portions. This embodiment is intended to make correction for the proximity effect in the peripheral portion of a chip so as to obtain a fine pattern by means of electron beam batch drawing. The acceleration voltage for the electron beam is 20 KeV and the size of a pattern to be formed by the transfer process is 1 μm. In this embodiment, as shown in FIG. 1, the width of apertures is made wider and wider by about 20 to 50% from a width of 100 aperture in the central portion to the peripheral portion, thereby making correction for insufficient exposure caused in the peripheral portion of the pattern due to the proximity effect so as to prevent the line thickness in the pattern from excessively decreasing. In the embodiment which will be described hereinbelow, when the right and left side portions, the upper and lower side portions and the four-corner portions of a chip are exposed, patterns which are corrected individually are used respectively. FIG. 2 illustrates a pattern forming method according to an embodiment of the present invention. Reference numeral 10 denotes a mask according to this invention, and 22 denotes a semiconductor wafer applied with resist. In the first place, aperture portions other than the first aperture portion 11 are covered with a shutter, and exposure is effected repeatedly with respect to the resist of the semiconductor wafer 22 while shifting the transferred position, thereby exposing a large area zone in the central portion of the chip. Subsequently, after changing the covered portion of the mask and the position of the wafer, the peripheral zone around the zone exposed through the first aperture 11 is to be exposed through the second apertures 12 to 19 separately. In FIG. 2, block transfer patterns 31 to 39 are those transferred through the apertures 11 to 19, respectively. In this case, a block transfer pattern 31 is exposed through the first aperture 11 repeatedly by nine shots in total, that is, three shots each for three lengthwise rows and three widthwise rows. Succeedingly, the block transfer patterns 33 and 38 each consisting of three shots in a lengthwise row are exposed through the second apertures 13 and 18, the block transfer patterns 35 and 36 each consisting of three shots in a widthwise row are exposed through the apertures 15 and 16, and the patterns 32, 34, 37 and 39 corresponding to the four-corner regions are exposed through the respective apertures 12, 14, 17 and 19, separately one by one. The above repeated exposure results, in this case, in the exposure of a chip 40 consisting of the exposed shots of the block transfer patterns 31 to 39, that is, five exposed shots each for five lengthwise rows and five widthwise rows. By developing the resist in succession, the chip 40 can be formed as shown in FIG. 3. In this case, the left and right apertures 13, 18 are increased in the widthwise dimensions thereof, respectively, the upper and lower apertures 15 and 16 are increased in the lengthwise dimensions thereof, respectively, and the four corner apertures 12, 14, 17 and 19 are increased in the dimensions thereof, respectively, thereby making correction for the deficiency of exposure. As shown in FIG. 3, it is possible to form a satisfactory chip pattern which is freed from such a problem that the line thickness decreases in the peripheral portion of the pattern. In other words, it is possible to form a pattern 41 with a uniform line thickness in each of the block transfer patterns 31 to 39.

In the present embodiment, although a contact hole pattern has been exemplified, it is possible to form other satisfactory patterns as well by making correction for the proximity effect using an exclusive mask having a plurality of patterns the line thickness of which is changed in the peripheral zone. On that occasion, the number of second aperture portions can be increased if necessary.

Further, besides the enlargement and reduction of the pattern of the group of second apertures, the proximity effect can be corrected also by changing the pattern form.

In addition, the present invention is also applicable to the exposure in which a beam of ions such as gallium is used as the exposure source.

As has been described above, according to the present invention, the dimensional change in the peripheral portion of the chip pattern attributable to the proximity effect which is inherent to a batch transfer process, can be suppressed efficiently without exchanging mask, and the dimensional uniformity of the whole chip pattern can be improved remarkably, thus showing great technical effects.

What is claimed is:

1. A pattern forming method of exposing a semiconductor substrate by an exposure technique that is subject to a proximity effect, so as to form on said semiconductor substrate at least one electronic chip comprising a plurality of regions including at least one center region and a plurality of peripheral regions surrounding said center region, said method comprising the steps of:
   exposing said substrate through a basic mask having apertures and having a basic size so as to form said at least one center region; and
   exposing said substrate through a plurality of correction masks having apertures and having sizes that are corrected with respect to said basic size for said proximity effect so as to form said plurality of peripheral regions.

2. A pattern forming method according to claim 1, wherein said exposure technique comprises a step of exposing said semiconductor substrate to a beam of charged particles, and wherein a resist is deposited on said substrate to be exposed to said beam of charged particles.

3. A pattern forming method according to claim 1, wherein said basic mask has a periphery and is integrally formed with said plurality of correction masks, said plurality of correction masks being adjacent to said periphery of said basic mask.

4. A pattern forming method according to claim 3, wherein said apertures in said correction masks have sizes that increase in a direction outward from said periphery of said basic mask.

* * * * *